United States Patent [19]

Ohtani et al.

[11] Patent Number: 4,744,063
[45] Date of Patent: May 10, 1988

[54] STATIC MEMORY UTILIZING TRANSITION DETECTORS TO REDUCE POWER CONSUMPTION

[75] Inventors: Takayuki Ohtani; Takayasu Sakurai, both of Tokyo; Mitsuo Isobe, Yokohama; Tetsuya Iizuka, Funabashi, all of Japan

[73] Assignee: Kabushiki Kaisha Toshiba, Kawasaki, Japan

[21] Appl. No.: 613,614

[22] Filed: May 24, 1984

[30] Foreign Application Priority Data

May 31, 1983 [JP] Japan ................................ 58-96113

[51] Int. Cl.$^4$ .............................................. G11C 8/00
[52] U.S. Cl. ................... 365/233; 365/227; 365/203
[58] Field of Search ............... 365/233, 227, 203, 190, 365/189, 230; 307/234

[56] References Cited

U.S. PATENT DOCUMENTS

| | | | |
|---|---|---|---|
| 3,942,162 | 3/1976 | Buchanan | 365/203 |
| 4,103,345 | 7/1978 | Suzuki et al. | 365/190 |
| 4,233,525 | 11/1980 | Takahashi et al. | 307/234 |
| 4,272,832 | 6/1981 | Ito | 365/233 |
| 4,337,525 | 6/1982 | Akatsuka | 365/233 |
| 4,405,996 | 9/1983 | Stewart | 365/227 |

FOREIGN PATENT DOCUMENTS

| | | | |
|---|---|---|---|
| 0004735 | 1/1980 | Japan | 365/203 |
| 0125595 | 9/1980 | Japan | 365/233 |

OTHER PUBLICATIONS

"A HI-CMOSII 8K×8b Static RAM" 1982 IEEE International Solid-State Circuits Conference, pp. 256–257, (1982). Minato et al.
Konishi et al., "A 64Kb CMOS RAM," IEEE International Solid-State Conference, ISSCC 82, Feb. 12, 1982, pp. 258–259.

Primary Examiner—Stuart N. Hecker
Assistant Examiner—Glenn A. Gossage
Attorney, Agent, or Firm—Finnegan, Henderson, Farabow, Garrett & Dunner

[57] ABSTRACT

A static memory has an address transition detector, an input data transition detector and a pulse signal generator. When a detector detects that an input address or input data has changed, the pulse signal generator produces a pulse signal having a width longer than the shorter of the data-reading or data-writing cycle. This pulse signal controls the period of time during which a penetrating DC current flows between two power sources via some of the components of the memory.

6 Claims, 6 Drawing Sheets

STATIC MEMORY UTILIZING TRANSITION DETECTORS TO REDUCE POWER CONSUMPTION

BACKGROUND OF THE INVENTION

This invention relates to an asynchronous static memory which consumes a small amount of power and can yet operate at a high speed even when the cycle time is long.

Static memories are classified into two types. The first type is a synchronous memory which is controlled by a sync signal supplied from an external device. The second type is an asynchronous memory which is not controlled by any sync signals.

A synchronous static memory consumes a small amount of power, but needs a sync signal (e.g., a chip-selecting signal or a chip-enabling signal) synchronous with an address change.

On the other hand, the asynchronous static memory does not need such a signal. However, it consumes much power since it includes a circuit in which a penetrating DC current flows between two power sources all the time the memory operates. A static memory of this type is disclosed in Osamu Minato, et al., "A HI CMOSII 8k×8b Static RAM" in *Digest of Technical Papers,* 1982, IEEE, International Solid-state Circuit Conference (ISSCC), pp. 256-257. Due to the penetrating current, it consumes much power regardless of its cycle time for data-writing or data-reading.

A new type of a static memory, called an "externally asynchronous, internally synchronous memory," has been developed. This memory is controlled by a sync signal generated within it. It is easy to operate and consumes a small amount of power. A static memory of this type is disclosed in Satoshi Konishi, et al., "A 64 Kb CMOS RAM" in *Digest of Technical Papers,* 1982, IEEE, International Solid-state Circuit Conference (ISSCC), pp. 258-259. In this synchronous memory, a change of an address is detected and a pair of bit lines is precharged within a period far shorter than the cycle time of the memory. At the same time, the bit lines are set to the same potential. Thereafter, a word line is energized to transfer data from a memory cell to the bit lines. A latch type sense amplifier then amplifies the the voltage between the bit lines, whereby the data is read through these lines. The amplifier consumes little power once it has latched the data, and helps to save power. It is necessary to amplify the voltage up to the power supply voltage. Hence, the bit lines cannot be quickly restored to the initial state in preparation for the next precharge. Therefore, the memory cannot operate at a high speed.

SUMMARY OF THE INVENTION

Accordingly the object of the present invention is to provide a static memory which consumes a small amount of power and yet can operate at a high speed.

A static memory according to the present invention comprises: an input detecting circuit for detecting the changes of at least one kind of signal; a pulse signal generating circuit for generating a pulse signal when said input detecting circuit detects the change of the signal, the pulse width of said signal being longer than the shortest data-reading or -writing cycle time; and a circuit in which a penetrating DC current flows between two power sources for a period determined by the pulse signal.

DETAILED DESCRIPTION OF THE PREFERRED EMBODIMENTS

Figure 1:
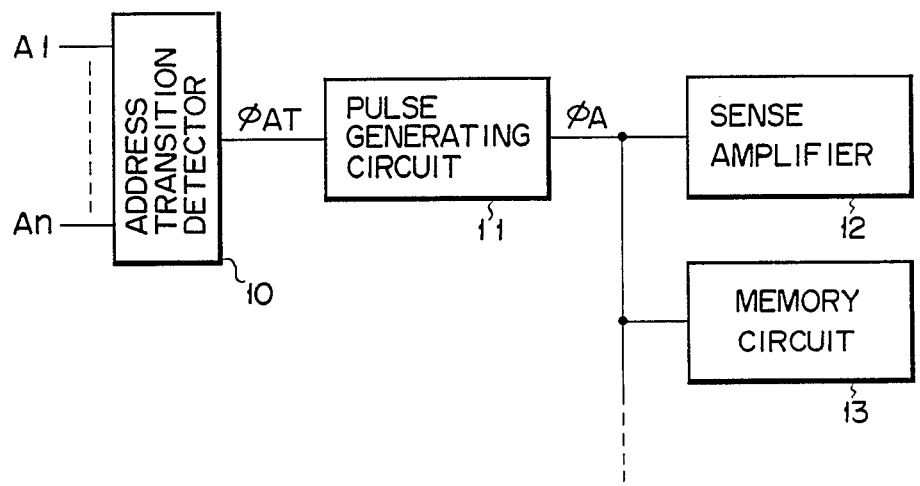
FIG. 1 illustrates the principle of a static memory according to the invention.

FIG. 1 is a block diagram of a static memory according to the present invention. Address input signals A1–An, which form n-bit address data, are simultaneously input to an address transition detector 10. Detector 10 detects the changes in the levels of these signals, thereby determining that the input address has changed. Detector 10 produces a pulse signal $\phi AT$. This signal is supplied to a pulse generating circuit 11. Circuit 11 generates a pulse signal $\phi A$ when it receives signal $\phi AT$. Signal $\phi A$ has a width greater than the minimum cycle time, the shortest data reading or writing period of the memory. Signal $\phi A$ is supplied to a sense amplifier 12, a memory circuit 13 and other circuits (not shown) to control the period during which a penerating DC current may flow through these circuits during the use of the memory. Sense amplifier 12, memory circuit 13 and the other circuits have the same cycle time, which is identical with said minimum cycle time.

A penetrating DC current flows through the sense amplifier 12, memory circuit 13, etc. only while the pulse signal $\phi A$ is at a high level. Therefore, the static memory does not consume much power, unlike the conventional asynchronous static memory which uses up great power regardless of the cycle time. Further, the penetrating DC current flowing between two power soruces during the use of the memory is large enough to operate sense amplifier 12, memory circuit 13, etc. at a sufficiently high speed.

Figure 2:
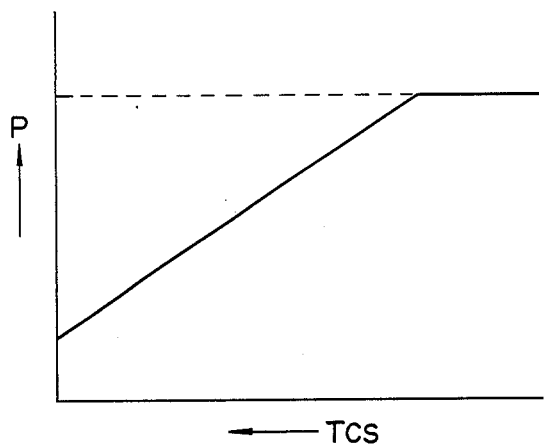
FIG. 2 is a diagram showing the characeristic of the memory shown in FIG. 1.

FIG. 2 illustrates the relationship between the cycle time Tcs and average power consumption P. The broken line indicates this relationship in the known asynchronous memory, and the solid line represents the Tcs-P relationship in the static memory according to the present invention. As evident from FIG. 2, the known memory consumes a specific amount of power, irrespective of the cycle time Tcs. By contrast, the memory of this invention consumes less power in inverse proportion to the cycle time Tcs. In addition, since pulse signal $\phi A$ has a width longer than the minimum cycle time, i.e., the period within which sense amplifier 12, memory circuit 13, etc. finish performing their functions, the memory makes no errors.

Figure 3:
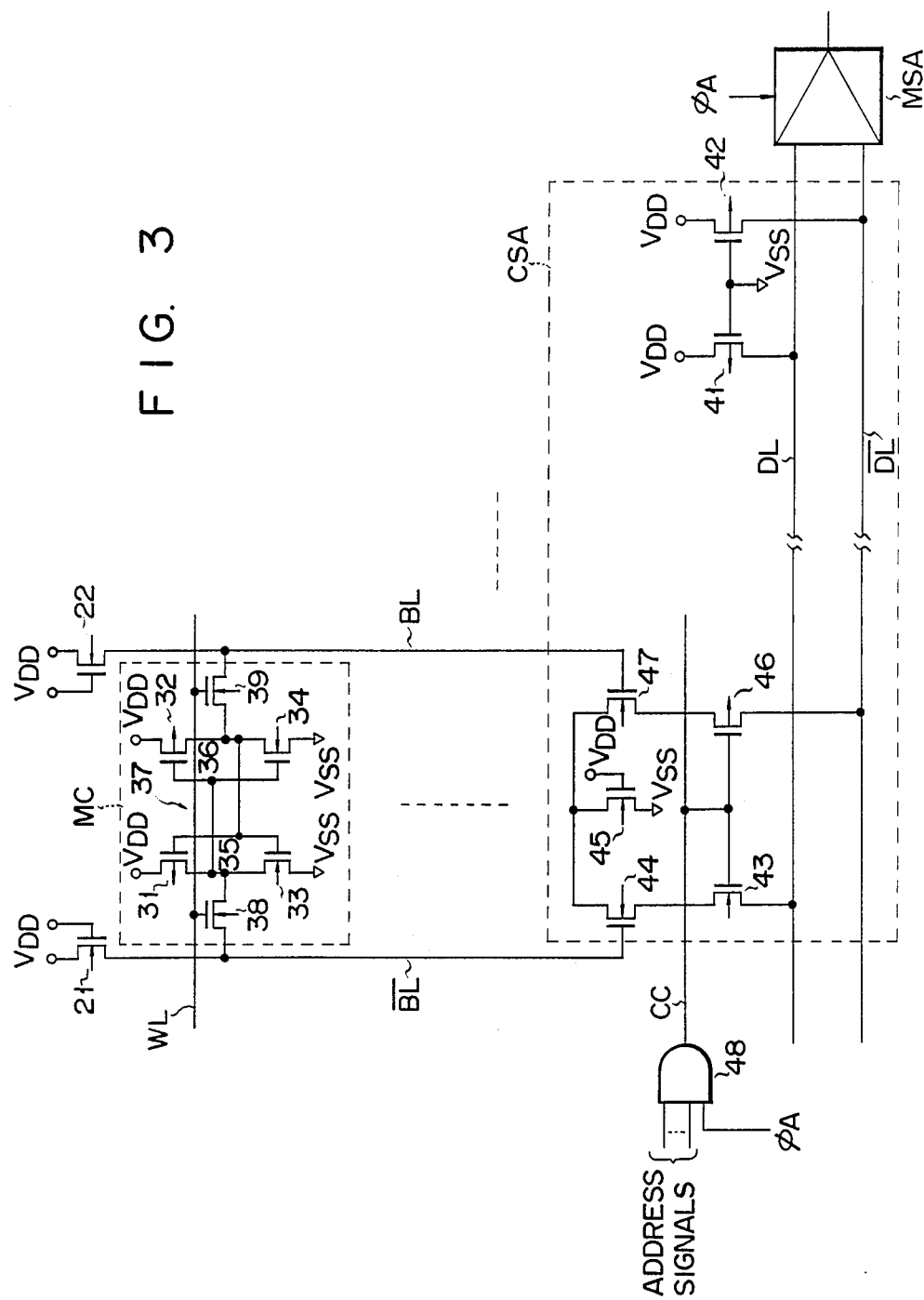
FIG. 3 shows a static memory according to the invention, which includes a column sense amplifier.

FIG. 3 shows a static memory of this invention, which includes a column sense amplifier. As shown in FIG. 3, an N-channel MOS transistor 21 is connected between a high-voltage source $V_{DD}$ and a bit line $\overline{BL}$, and another N-channel MOS transistor 22 is connected between voltage source $V_{DD}$ and a bit line BL. The gates of both MOS transistors 21 and 22 are coupled to voltage source $V_{DD}$. Hence, these MOS transistors, which are used as loads, are on all the time. At least one memory cell MC is arranged between the bit lines $\overline{BL}$, BL which form a pair. Memory cell MC comprises a flip-flop 37 and two N-channel MOS transistors 38 and 39. Flip-flop 37 consists of two CMOS inverters 35 and 36 which are coupled in the opposite directions. CMOS inverter 35 is coupled between voltage source $V_{DD}$ and a low voltage source $V_{SS}$, and comprises a P-channel MOS transistor 31 and an N-channel MOS transistor 33. CMOS inverter 36 is also coupled between voltage sources $V_{DD}$ and $V_{SS}$, and is formed of a P-channel MOS transistor 32 and an N-channel MOS transistor 34. N-channel MOS transistors 38, 39, which are used as transfer gates, are connected to bit lines $\overline{BL}$ and BL, respectively. Further, the gates of these N-channel MOS transistors are connected in parallel to a word line WL.

A column sense amplifier CSA is provided to amplify the potentials on the bit lines $\overline{BL}$, BL and then to supply the amplified potentials to two data lines DL and $\overline{DL}$, respectively. Amplifier CSA comprises P-channel MOS transistors 41 and 42 which are used as loads. MOS transistor 41 is connected between data line DL and high-voltage source $V_{DD}$, and MOS transistor 42 is coupled between data line $\overline{DL}$ and high voltage source $V_{DD}$. The gates of these P-channel transistors are connected to low-voltage source $V_{SS}$. Hence, both transistors 41 and 42 are on all the time. Amplifier CSA further comprises three N-channel MOS transistors 43, 44 and 45 connected in series between data lines DL and voltage source $V_{SS}$. The gate of transistor 43 is coupled to a line CC for supplying a control signal to amplifier CSA. The gate of transistor 44 is coupled to bit line $\overline{BL}$. The gate of transistor 45 is connected to voltage source $V_{DD}$. Therefore, transistor 45, which is used to supply power source current, is on all the time. Amplifier CSA further comprises two N-channel MOS transistors 46, 47 connected in series between data lines $\overline{DL}$ and the connection point between transistors 44 and 45. The gate of transistor 46 is connected to line CC, and the gate of transistor 47 is coupled to bit line BL. Amplifier CSA includes AND circuit 48 which receives l signals obtained from address signals Al-An and the pulse signal $\phi A$. The output signal from this AND circuit is supplied to line CC. The signals on the data lines DL, $\overline{DL}$ are supplied to a main sense amplifier MSA which operates in response to pulse signal $\phi A$.

It will now be described how data is read from the memory cell MC. When at least one of the address signals Al-An (FIG. 1) changes, that is, when the input address data changes, the output pulse signal $\phi A$ of pulse generating circuit 11 (FIG. 1) rises to logical "1" level, thereby turning on the transistors 43, 46 of column sense amplifier CSA. Word line WL is then energized, whereby the transistors 38, 39 of memory cell MC coupled to word line WL are turned on. As a result, data is read from flip-flop 37 via the bit lines $\overline{BL}$, BL. This data sets bit line $\overline{BL}$ or bit line BL at an intermediate potential between voltages $V_{DD}$ and $V_{SS}$, while the other bit line is set at the potential equal to voltage $V_{DD}$.

The source-drain impedances of the transistors 44, 47 of amplifier CSA are controlled by the gate potentials of these transistors 44, 47, respectively. At this time, transistors 43 and 46 are turned on by the signal on line CC. Hence, a DC current flows through the path formed of transistors 41, 43, 44 and 45, and another DC current flows through the path comprised of transistors 42, 46, 47 and 45. Then two signals which correspond to the potentials of bit lines $\overline{BL}$ and BL are supplied to data lines DL and $\overline{DL}$, while pulse signal $\phi A$ stays at a high level, and main sense amplifier MSA operates. Amplifier MSA amplifies the signals supplied to these data lines DL, $\overline{DL}$, and outputs data corresponding to these signals. When the difference between the potentials of bit lines $\overline{BL}$ and BL becomes sufficiently large due to the data stored in memory cell MC, and when the potentials of the bit lines are fully amplified by column sense amplifier CSA, pulse signal $\phi A$ falls to a low level. The DC penetrating current therefore stops flowing via amplifier CSA.

In short, a penetrating DC current flows through column sense amplifier CSA only while amplifier CSA is operating, thereby amplifying the potentials of bit lines $\overline{BL}$ and BL. Since the duration of pulse signal $\phi A$ is constant, the longer the cycle time, the less the average power consumption. In addition, column sense amplifier CSA can operate at a high speed as the column sense amplifier used in the known asynchronous static memory.

In the circuit of FIG. 3, transistor 45 may be omitted. In this case, transistors 44 and 47 must be coupled at one end to low-voltage source $V_{SS}$. Further, pulse signal $\phi A$ may be input to the gate of transistor 45, not to AND circuit 48, so that transistor 45 may remain on while pulse signal $\phi A$ is at a high level.

Figure 4:
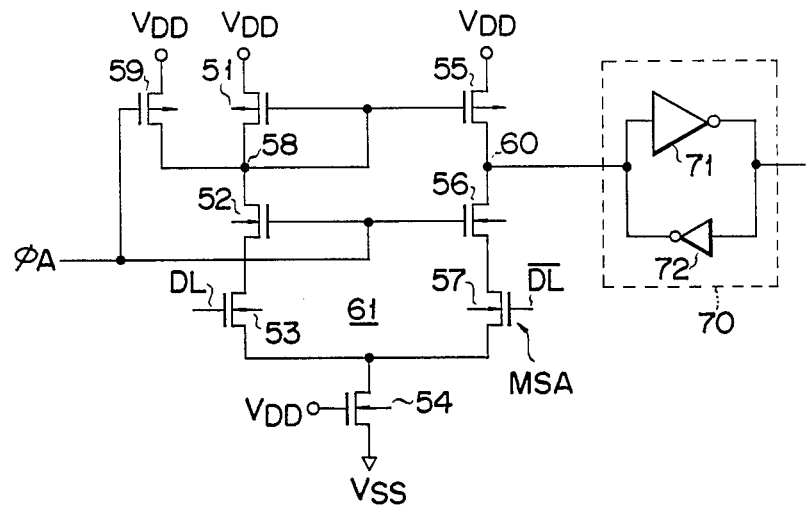
FIG. 4 shows the main sense amplifier used in the static memory shown in FIG. 3.

FIG. 4 is a circuit diagram of the main sense amplifier MSA shown in FIG. 3. Amplifier MSA has one P-channel MOS transistor 51 and three N-chanel MOS transistors 52, 53 and 54. Theses transistors are connected in series, forming a series circuit which is coupled between the high voltage source $V_{DD}$ and low voltage source $V_{SS}$. Amplifier MSA further has one P-channel MOS transistor 55 and two N-channel MOS transistors 56, 57. These transistors 55, 56, 57 are also coupled in series. The series circuit formed by them is connected in parallel to the series circuit formed of N-channel transistors 52, 53 and 54. The gates of P-channel transistors 51 and 55 are connected, and the connection point between them is coupled to the connection point 58 between transistors 51 and 52. The gates of N-channel MOS transistor 52 and 56 are coupled, and the connection point between them receives pulse signal $\phi A$. The gate of transistor 53 is coupled to the data line DL (FIG. 3), and the gate of transistor 57 is connected to the data line $\overline{DL}$ (FIG. 3). The gate of transistor 54 is coupled to high-voltage source $V_{DD}$. Main sense amplifier MSA further includes a P-channel MOS transistor 59 coupled between voltage source $V_{DD}$ and the connection point 58 between the transistors 51, 52. The gate of this transistor 59 receives pulse signal $\phi A$. The connection point 60 between the transistors 55, 56 is connected to the input terminal of a latch circuit 70. Latch circuit 70 comprises two inverters 71 and 72 connected in parallel in the opposite directions.

Transistors 51, 52, 53, 54, 55, 56, 57, 59 form a differential amplifier 61. In differential amplifier 61, transistors 53 and 57 are used as drive transistors of a differential input type, and transistors 51 and 55 are used as load transistors of a current mirror type. Latch circuit 70 is coupled to the output of differential amplifier 61. Amplifier 61 is controlled by MOS transistors 52, 56 and 59 which receive pulse signal $\phi A$ as their gate input. While signal $\phi A$ is at a high level, transistors 52 and 56 are on. Differential amplifier 61 therefore starts amplifying the potentials of data lines DL and $\overline{DL}$. The data corresponding to the potential difference between lines DL and $\overline{DL}$ is output from the connection point 60, i.e., the output terminal of differential amplifier 61. This data is latched by latch circuit 70.

Also in the main sense amplifier MSA of FIG. 4, a penetrating DC current flows between voltage sources $V_{DD}$ and $V_{SS}$ only while amplifier MSA is operating. Hence, the longer the cycle time, the less the average power consumption, as in the circuit of FIG. 3. In addition, the amplifier MSA can operate at a high speed as the main sense amplifier used in the conventional asynchronous static memory.

In the main sense amplifier MSA of FIG. 4, the P-channel transistor 59, which is connected between voltage source $V_{DD}$ and the connection point 58 of MOS transistors 51, 52, is conducting while pulse signal $\phi A$ is at a low level and while differential amplifier 61 is in the inoperative state. As long as transistor 59 is on, the ptential at the connection point 58 is forcedly raised to $V_{DD}$ level. By contrast, P-channel MOS transistor 55 connected to the output of amplifier 61 is off while the amplifier 61 remains inoperative. Likewise, N-channel transistor 56, which is coupled to the output of amplifier 61, is off. The output of amplifier 61 is therefore held at a high impedance. This prevents the latch circuit 71 from making errors. Moreover, pulse signal $\phi A$ is input only when amplifier MSA is in the "chip enable" state. Otherwise, circuit 11 (FIG. 1) for generating signal $\phi A$ would operate when the input address changes, and would increase the power consumption.

Figure 5:
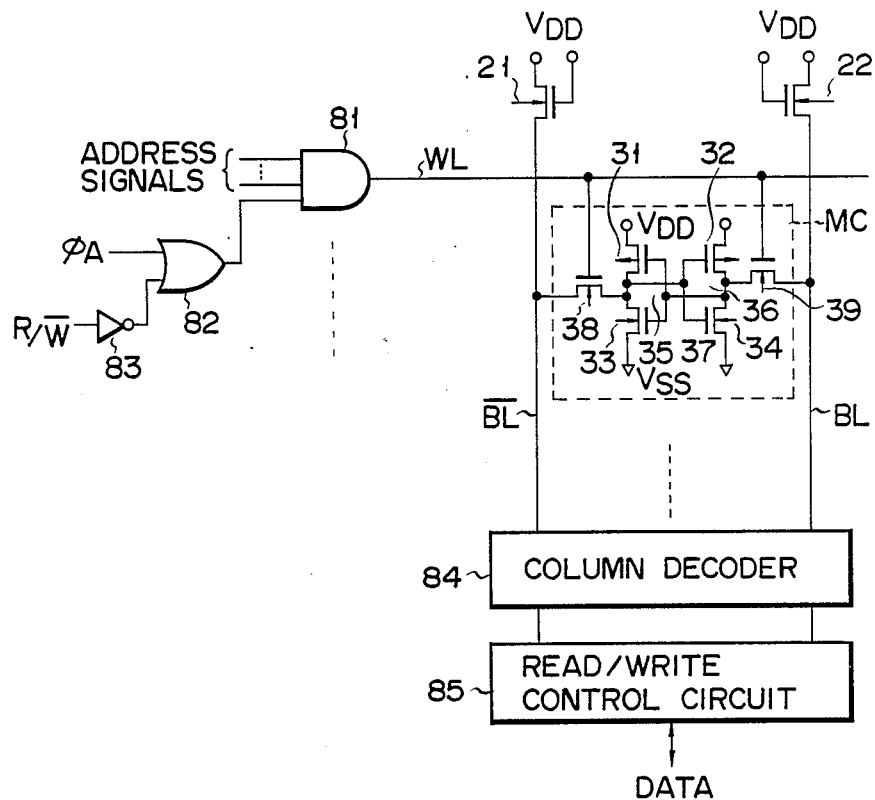
FIG. 5 illustrates a memory circuit using the static memory of the invention.

FIG. 5 shows a memory circuit according to this invention. This circuit comprises memory cell MC, bit lines $\overline{BL}$, BL, and load MOS transistors 21, 22 (FIG. 3). The memory circuit includes an AND circuit 81. The output signal of this AND circuit 81 controls a word line WL. AND circuit 81 and other AND circuits (not shown) form a row address decoder. L signals obtained from address signals A1-An and the output signal from an OR circuit 82 are supplied to AND circuit 81. Pulse signal $\phi A$ is supplied to one input terminal of OR circuit 82, and a read/write control signal $R/\overline{W}$ is supplied to the other input of OR circuit 82 via an inverter 83. A column decoder 84 and read/write control circuit 85 are coupled to both bit lines $\overline{BL}$ and BL.

To write data in the memory circuit of FIG. 5 or to read the data therefore, AND circuit 81 (i.e., the row decoder) and column decoder 84 cooperate to select one memory cell MC. Data is then written in the selected memory cell MC or read therefrom under the control of a read/write control circuit 86. More specifically, in order to read data, the output signal from AND circuit 81 is activated while the pulse signal $\phi A$ stays at the high level. Hence, the word line WL is energized, and the MS, transistors 38, 39 of memory cell MC are turned on and remains on for a predetermined period. During this period, the data stored in flip-flop 37 is read out through bit lines $\overline{BL}$ and BL. If low-level data is read via bit line BL, a penetrating DC current will flow through the path formed of load MOS transistor 21, bit line $\overline{BL}$ and memory cell MC. Conversely, if low-level data is read via bit line BL, this current will flow through the path made of load MOS transistor 22, bit line BL and memory cell MC. For example, when cell MC stores such data that MOS transistor 33 is on, the DC current will flow through the path composed of MOS transistor 21, bit line $\overline{BL}$, MOS transistor 38 and MOS transistor 33.

The period during which the DC current flows to read the data from memory cell MC is limited; it need not be long. Hence, the longer the cycle time, the less average power consumed. Furthermore, since the DC current flows during the data-reading period, the potentials of both bit lines fall to an intermediate level between the $V_{DD}$ and $V_{SS}$ levels, not to the $V_{SS}$ level. The potentials of both bit lines can be restored quickly, and the memory circuit can therefore operate at a high speed.

Data can no longer be written in the memory circuit of FIG. 5 if word line WL is deenergized upon the lapse of a specific period after the address has changed. To avoid this, the read/write control signal $R/\overline{W}$ keeps the output signal of OR circuit 82 at a high level during the data-writing process, regardless of the level of pulse signal $\phi A$. That is, the word line WL is energized throughout the data-writing process. Hence, the circuit of FIG. 5 consumes a lot of power to write data, though its need very little power to read data.

Figure 6:
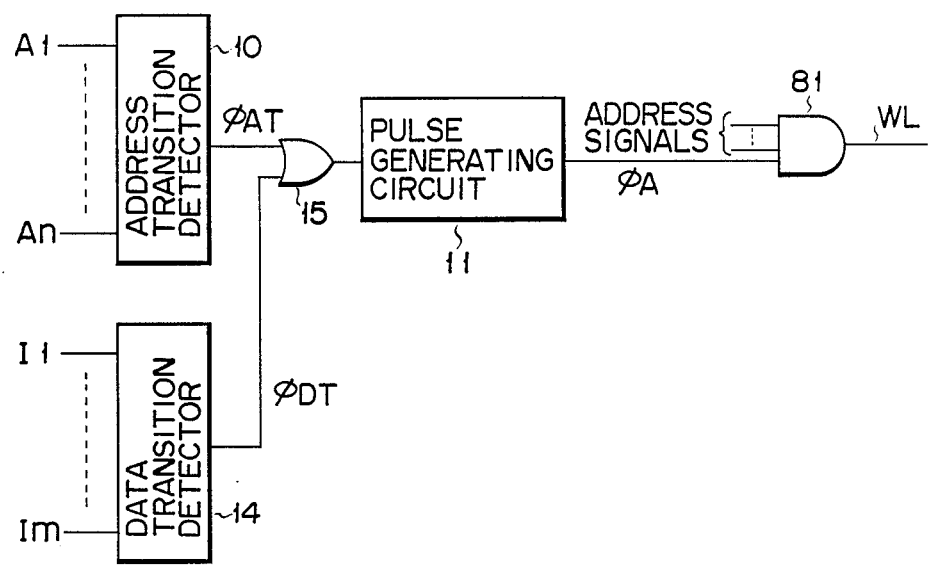
FIG. 6 shows a modification of the circuit shown in FIG. 5.

FIG. 6 shows a modification of the circuit shown in FIG. 5. This circuit is so designed as to reduce power consumption not only during the data-reading process but also during the data-writing process. It comprises an address transition detector 10 and a data transition detector 14. Address input signal A1-An are simultaneously input to an address transition detector 10. Detector 10 detects the changes in the levels of signals A1-An to determine that the input address has changed. Subsequently it produces a pulse signal $\phi AT$. On the other hand, data transition detector 14 receives m-bit input data consisting of data signals I1-Im and detects the changes in the levels of these signals to determine if the data has changed. Detector 14 also generates a pulse signal $\phi DT$. Pulse signal $\phi AT$ and $\phi DT$ are input to an OR circuit 15. The output signal of this OR circuit is supplied to a pulse generating circuit 11. Circuit 11 produces a pulse signal $\phi A$ having a given width. Pulse signal $\phi A$ is supplied to the first input terminal of an AND circuit 81. N signals obtained from address signals A1-An are supplied to the other input terminals of AND circuit 81.

Therefore, every time the input data changes, pulse generating circuit 1 produces a pulse signal $\phi A$. A penetrating DC current flows for a sufficiently long period within which data is completely written in a memory cell. Accordingly, the power consumption is far smaller than in the case where the word line WL is energized under the control of signal $R/\overline{W}$ throughout the data-writing process.

Figure 7:
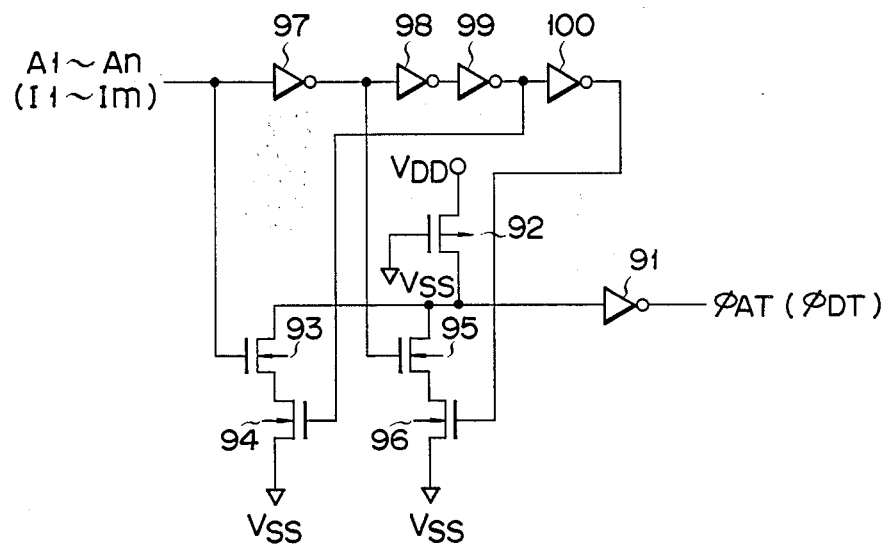
FIG. 7 shows the one-bit unit of the address transition detector or data transition detector shown in FIG. 6.

FIG. 7 illustrates the one-bit unit of address transition detector 10. This unit is identical with the one-bit unit of transition detector 14. It has a P-channel load MOS transistor 92 coupled between the high-voltage source $V_{DD}$ and the input terminal of an inverter 91. The gate of transistor 92 is coupled to the low-voltage source $V_{SS}$. N-channel MOS transistors 93 and 94 are connected in series, thus forming a series circuit. This series circuit is connected in parallel to the series circuit of N-channel MOS transistors 95 and 96. Both series circuits are coupled between the input terminal of inverter 91 and voltage source $V_{SS}$. Four inverters 97-100 are cascade-connected. One of the address signals A1–An is supplied to the first-stage inverter 97 and also to the gate of transistor 93. The output signal of inverter 99 is input to the gate of tansistor 94. The output signal of inverter 97 is supplied to the gate of transistor 95, and the output signal of inverter 100 is supplied to the gate of transistor 96.

In the one-bit unit of FIG. 7, as long as the address signal A1, A2, ... or An is at a low level, the transistors 93, 96 are off, and the input terminal of inverter 91 is disconnected from low-voltage source $V_{SS}$. The output signal of inverter 91 is therefore at a low level. When the address signal rises to a high level, the output signal of inverter 99 falls to a low level upon the lapse of a period which is the sum of the delay periods of inverters 97, 98 and 99. Transistor 93 is turned on immediately after the address signal has risen to a high level. By contrast, transistor 94 is held in a conductive state until the output signal from inverter 99 falls to a low level. Accordingly, after the input data signal has risen to a high level, the transistors 93, 94 are turned on and held in the conducting state for a period of time to set the input signal to inverter 91 at a low level. As a result, the output signal $\phi A$ of inverter 91 remains at a high level for a specific period after the input address signal has risen to a high level. The transistors 95, 96 are used to hold the input signal to inverter 91 at a low level for said specific period of time, so that inverter 91 outputs signal $\phi AT$.

Figure 8:
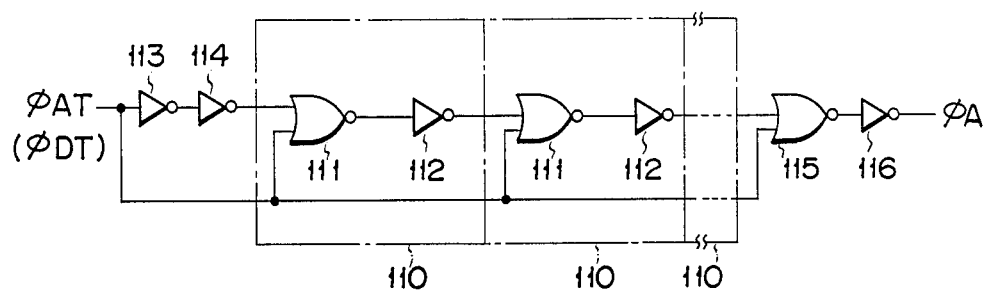
FIGS. 8-10 show pulse signal generating circuits which may be used in the circuit of FIG. 6.
Figure 9:
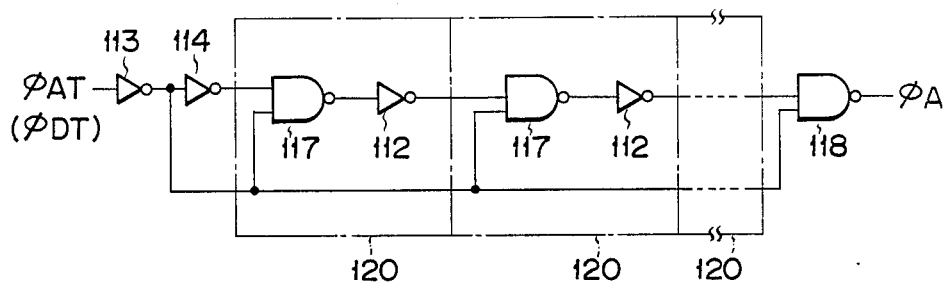
Figure 10:
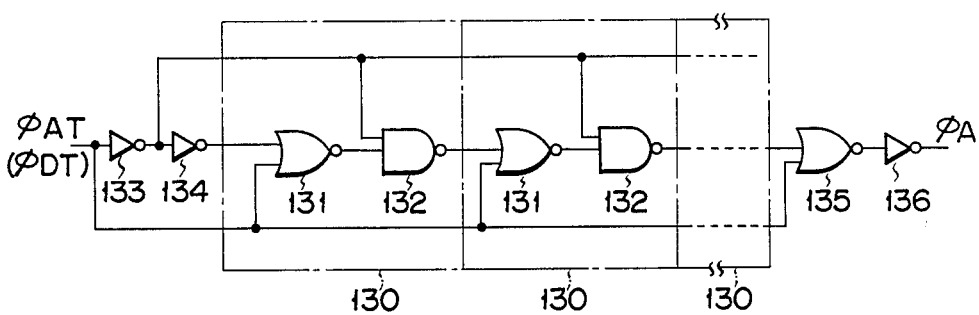

FIGS. 8, 9 and 10 show pulse generating circuits which may be used the same way as circuit 11.

The circuit of FIG. 8 comprises a plurality of delay circuits 110. Each delay circuit 110 consists of a 2-input NOR circuit 111 and an inverter 112 coupled to the output of this NOR circuit. The pulse signal $\phi AT$ (or $\phi DT$) is supplied via two serially connected inverters 113 and 114 to the first input terminal of the first-stage delay circuit. The first input terminal of the NOR circuit 111 of any other delay circuit receives the output signal from the inverter 112 of the preceding delay circuit. The pulse signal $\phi AT$ (or $\phi DT$) is input to the second terminals of the NOR circuits 111 of all delay circuits. The output signal of the last-stage delay circuit is input to the first input terminal of a 2-input NOR circuit 115, and pulse signal $\phi AT$ (or $\phi DT$) is input to the second input terminal of NOR circuit 115. The output signal of NOR circuit 115 is input to an inverter 116, the output signal of which is the pulse signal $\phi A$.

The circuit of FIG. 9 comprises a plurality of delay circuits 120. Each delay circuit consists of a 2-input NAND circuit 117 and an inverter 112 coupled to the output of NAND circuit. The pulse signal $\phi AT$ (or $\phi DT$) is supplied via serially connected inverters 113 and 114 to the first input terminal of the first-stage delay circuit. The first input terminal of the NAND circuit of any other delay circuit receives the output signal from the inverter 112 of the preceding delay circuit. The output signal of the inverter 113 is input to the second terminals of the NAND circuits of all delay circuits. The output signal of the last-stage delay circuit is input to the first input terminal of a 2-input NAND circuit 118, and output signal of the inverter 113 is supplied to the second input terminal of this NAND circuit, the output signal of which is the pulse signal $\phi A$.

The circuit of FIG. 10 comprises a plurality of cascade-connected delay circuits 130. Each circuit 130 consists of a 2-input NOR circuit 131 and a 2-input NAND circuit 132, one input of which is coupled to the output or NOR circuit. The pulse signal $\phi AT$ (or $\phi DT$) is input to the first input terminal of the NOR circuit 131 of the first-stage delay circuit via serially connected inverters 133 and 134. The first input of the NOR circuit of any other delay circuit is coupled to the output of the NAND circuit of the preceding delay circuit. Pulse signal $\phi AT$ (or $\phi DT$) is supplied to the second input terminal of the NOR circuit of any delay circuit. The second input terminal of the NAND circuit of any delay circuit is connected to the output terminal of the inverter 133. The output signal of the last-stage delay circuit and the pulse signal $\phi AT$ (or $\phi DT$) are supplied to a 2-input NOR circuit 135. The output signal from this NOR circuit is input to an inverter 136. The output signal of inverter 136 is the pulse signal $\phi A$.

The circuits of FIGS. 8, 9 and 10 generate an output signal $\phi A$ which rises to a high level at the leading edge of pulse signal $\phi AT$ or $\phi DT$ and then falls to a low level upon the lapse of the period equal to the sum of the delay times of delay circuits 110, 120 or 130. The width of this signal $\phi A$ is determined by the number of delay circuits 110, 120 or 130. When the input signal $\phi AT$ or $\phi DT$ rises to a high level before the output signal $\phi A$ falls to the low level, signal $\phi A$ is held at a high level for a predetermined time. The circuits of FIGS. 8, 9 and 10 therefore ensure the correct operations of sense amplifier 12, memory cell MC and the other circuits (FIG. 1).

Figure 11:
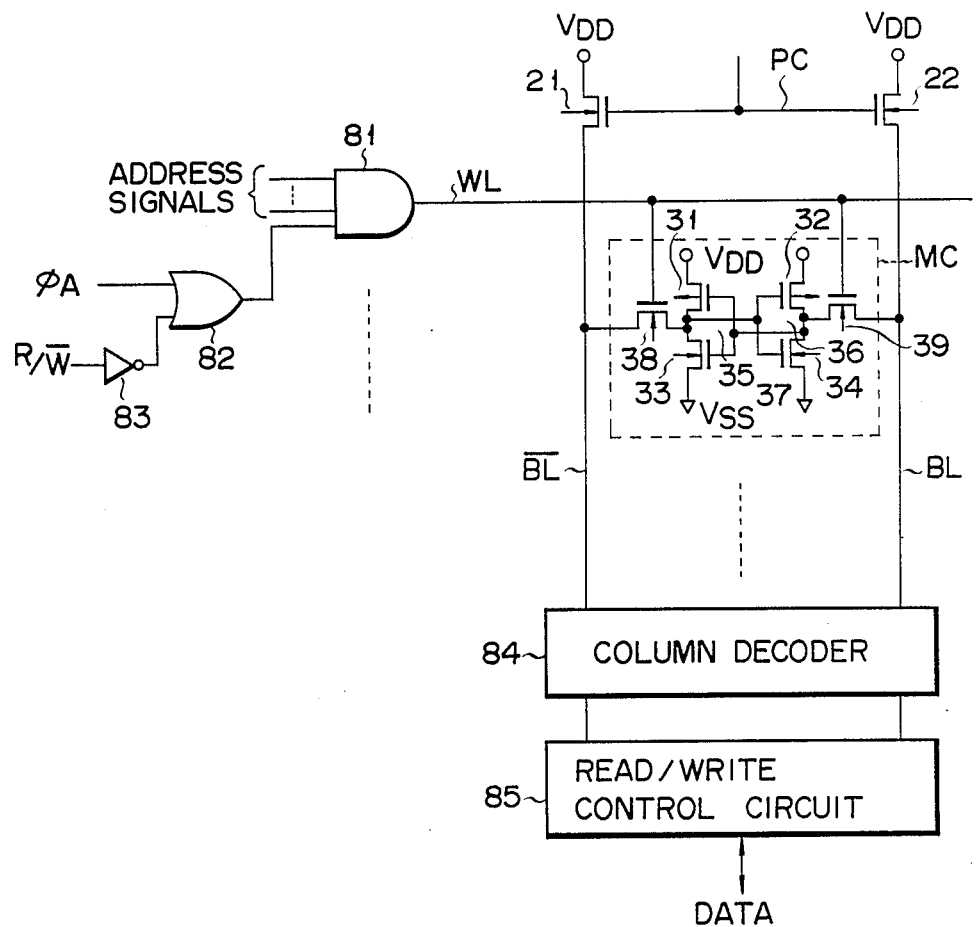
FIG. 11 illustrates another memory circuit using the static memory according to this invention.

FIG. 11 shows another memory circuit according to the present invention, which comprises the memory cell MC, bit lines $\overline{BL}$, BL and load MOS transistors 21, 22 shown in FIG. 5. This circuit is different from the circuit of FIG. 5 in that the gates of transistors 21 and 22, which are the loads of bit lines $\overline{BL}$ and BL, are connected in parallel to a precharge line PC, not to the high voltage source $V_{DD}$.

Data is written in, or read from, the memory cell MC in the following manner. First, precharge line PC is set at a high level, thereby turning transistors 21 and 22 on and subsequently precharging both bit lines $\overline{BL}$ and BL to $V_{DD}$ - Vthn level. Vthn is the threshold voltage of the N channel transistor 21. The memory cell MC is selected by an AND circuit 81 functioning as a row decoder, and by a column decoder 84. Thereafter, the data is written in, or read from, the selected memory cell MC under the control of a read/write control circuit 85.

In the memory circuit of FIG. 11, the bit lines $\overline{BL}$, BL are not held at a high level at all times. They are set at a high level only while they are being precharged. Therefore, no penetrating DC current flows between voltage sources $V_{DD}$ and $V_{SS}$ while the data is being read or written, unlike in the circuit of FIG. 5. However, a DC discharge current flows between these voltage sources via memory cell MC. Since bit lines $\overline{BL}$ and BL are precharged before every data is read on written, they may be discharged while the pulse signal $\phi A$ is at a high level. This prevents the potential of bit line $\overline{BL}$ or BL from falling to $V_{SS}$ level these lines are being discharged and, hence, saves electrical power.

The present invention is not limited to the embodiments described above. Various changes and modifications can be made within the scope of the invention. In the above embodiments, the period during which a penetrating DC current or a DC discharge current is controlled occurs when the change of the address data or input data is detected. Instead, this period may be controlled upon detecting the change of at least one of the input signals including the address data, input data, chipenabling signal and read/write control signal. For instance, if the circuit is set to the chip-enable access mode so as to start data-reading when the chipenabling signal falls to a low level, electrical power can be saved.

What is claimed is:

1. A static memory receiving a plurality of address signals and multiple bit input data for storage and having data-reading and data-writing cycle times, said memory comprising:

a first power source;

a second power source;

input detecting means for detecting changes of said address signals and of said multiple bit input data;

pulse signal generating means for generating a pulse signal when said input detecting means detects a change of one of said address signals or mulitple bit input data, the width of said pulse signal being longer than the data-reading and data-writing cycle times; and circuit means, responsive to said pulse signal, for causing a penetrating direct current to flow between said first and second power sources through circuit elements in said circuit means for a period of time corresponding to the width of said pulse signal.

2. A static memory according to claim 1, wherein said circuit means includes a sense amplifier and a switching element, coupled between said first and second power sources, and controlled by the pulse signal.

3. A static memory according to claim 1, wherein said circuit means includes a memory circuit comprising:

a pair of bit lines, load means connected between said first power source and one of said bit lines for continuously supplying current from said first power source to said bit lines, static data memory means connected between said bit lines, and a switching element responsive to said pulse signal and coupled between said one of said bit lines and the static data memory means.

4. A static memory according to claim 3, wherein said switching element includes means for responding to the pulse signal while data is being read from said static data memory means.

5. A static memory receiving address signals and multiple bit input data for storage and having data-reading and data-writing cycle times, said memory comprising:

a first power source;

a circuit point charged by said first power source;

a second power source;

input detecting means for detecting changes of said address signals and of said multiple bit input data;

pulse signal generating means for generating a pulse signal when said input detecting means detects a change of one of said address signals or multiple bit input data, the width of said pulse signal being longer than the data-reading and data-writing cycle times; and circuit means, responsive to said pulse signal, for causing a penetrating direct current to flow between said circuit point and said second power source through circuit elements in said circuit means for a period of time corresponding to the width of said pulse signal.

6. A static memory according to claim 5, wherein said circuit means includes a memory circuit comprising:

a pair of bit lines, charging means connected between said first power source and one of said bit lines for charging said bit lines for a predetermined period of time, static data memory means connected between said pair of bit lines, and a switching element responsive to said pulse signal and coupled between said one of said bit lines and the static data memory means.

* * * * *